United States Patent
Hashimoto et al.

(10) Patent No.: US 11,677,211 B2
(45) Date of Patent: Jun. 13, 2023

(54) SEMICONDUCTOR DEVICE, SEMICONDUCTOR DEVICE PACKAGE, AND MANUFACTURING METHODS THEREOF

(71) Applicants: NICHIA CORPORATION, Anan (JP); SHINKO ELECTRIC INDUSTRIES CO., LTD., Nagano (JP)

(72) Inventors: Takuya Hashimoto, Tokushima (JP); Eiichiro Okahisa, Tokushima (JP); Katsuya Nakazawa, Nagano (JP); Shigeru Matsushita, Nagano (JP); Sumio Uehara, Nagano (JP); Suguru Kobayashi, Nagano (JP); Kazuhito Yumoto, Nagano (JP)

(73) Assignees: NICHIA CORPORATION, Anan (JP); SHINIKO ELECTRIC INDUSTRIES CO., LTD., Nagano (JP)

( * ) Notice: Subject to any disclaimer, the term of this patent is extended or adjusted under 35 U.S.C. 154(b) by 443 days.

(21) Appl. No.: 17/063,140

(22) Filed: Oct. 5, 2020

(65) Prior Publication Data

US 2021/0021097 A1 Jan. 21, 2021

Related U.S. Application Data

(62) Division of application No. 16/365,580, filed on Mar. 26, 2019, now Pat. No. 10,833,473.

(30) Foreign Application Priority Data

Mar. 27, 2018 (JP) .............................. JP2018-059983
Jul. 13, 2018 (JP) .............................. JP2018-132799

(51) Int. Cl.
*H01S 5/02208* (2021.01)
*H01S 5/0235* (2021.01)
(Continued)

(52) U.S. Cl.
CPC ........ *H01S 5/0235* (2021.01); *H01S 5/02208* (2013.01); *H01S 5/02355* (2021.01);
(Continued)

(58) Field of Classification Search
CPC ........................... H01S 5/02208; H01S 5/0235
See application file for complete search history.

(56) References Cited

U.S. PATENT DOCUMENTS 6,020,867 A 2/2000 Shimada et al.
10,714,518 B2 7/2020 Matsuzawa
(Continued)

FOREIGN PATENT DOCUMENTS

JP 2001-264590 A 9/2001
JP 2004-022964 A 1/2004
(Continued)

OTHER PUBLICATIONS

Notice of Allowance on U.S. Appl. No. 16/365,580 dated Jul. 24, 2020.

(Continued)

*Primary Examiner* — Tuan N Nguyen
(74) *Attorney, Agent, or Firm* — Foley & Lardner LLP

(57) ABSTRACT

A semiconductor device includes: a bottom plate having an upper surface and a lower surface, wherein the upper surface comprises an outer peripheral part and an inside part that is enclosed by the outer peripheral part and that protrudes more upward than the outer peripheral part; a frame joined to the upper surface of the bottom plate and comprising a first through-hole that penetrates the frame; a plate jointed to the outside or inside surface of the frame, the plate comprising a second through-hole that penetrates the plate in a same direction as that of the first through-hole, a thickness of the plate being greater than a thickness of the frame; a lead terminal inserted into the first through-hole and the second (Continued)

through-hole; a fixing member provided in the second through-hole and fixing the lead terminal; and a semiconductor element fixed to the inside part.

17 Claims, 22 Drawing Sheets

(51) Int. Cl.
  *H01S 5/40* (2006.01)
  *H01S 5/024* (2006.01)
  *H01S 5/02355* (2021.01)
  *H01S 5/02255* (2021.01)
(52) U.S. Cl.
  CPC ............ *H01S 5/02469* (2013.01); *H01S 5/40* (2013.01); *H01S 5/02255* (2021.01)

(56) References Cited

U.S. PATENT DOCUMENTS

2017/0338628 A1* 11/2017 Matsushita ............. H01L 33/62
2019/0305511 A1 10/2019 Hashimoto et al.

FOREIGN PATENT DOCUMENTS

| JP | 2012-015321 A | 1/2012 |
| JP | 2012-064785 A | 3/2012 |
| JP | 2017-208484 A | 11/2017 |

OTHER PUBLICATIONS

Notice of Allowance on U.S. Appl. No. 16/365,580 dated Aug. 10, 2020.

* cited by examiner

SEMICONDUCTOR DEVICE, SEMICONDUCTOR DEVICE PACKAGE, AND MANUFACTURING METHODS THEREOF

CROSS-REFERENCE TO RELATED APPLICATIONS

The present application is a divisional of U.S. patent application Ser. No. 16/365,580, filed on Mar. 26, 2019, which claims priority to Japanese Patent Application No. 2018-059983, filed on Mar. 27, 2018, and Japanese Patent Application No. 2018-132799, filed on Jul. 13, 2018, the disclosures of which are hereby incorporated by reference in their entireties.

TECHNICAL FIELD

The present disclosure relates to a semiconductor device, a semiconductor device package and manufacturing methods thereof.

BACKGROUND

Japanese Patent Publication No. 2017-208484 describes a light-emitting device including: a base; a light-emitting element; a frame that is joined to an upper surface of the base so as to enclose the light-emitting element; and a lid that is joined to the frame. In a case where the frame and the base have different thermal expansion coefficients, warpage may occur when the frame is heated and joined to the base using a joining material such as a silver solder material and then cooled. In this case, for example, a lower surface of the base, which is warped such that a central part thereof is higher than an outer peripheral part thereof, can be polished using a polishing plate until heights of the central part and the outer peripheral part become more or less similar. Accordingly, because the lower surface can be planarized, the lower surface can be more readily fixed to a heat sink or the like.

Japanese Patent Application Laid-open No. 2004-22964 describes a process of making a heat radiating component constituted by a plate-like Al—SiC composite in a shape in which a lower surface protrudes from an end part of the heat radiating component toward a central part thereof and joining a semiconductor substrate to the heat radiating component. When the semiconductor substrate is joined to the heat radiating component by soldering, because the entire heat radiating component warps, a protrusion amount of the lower surface of the heat radiating component is smaller after joining the semiconductor substrate as compared to before joining the semiconductor substrate.

SUMMARY

Although Japanese Patent Publication No. 2017-208484 describes performing polishing in order to planarize a warped lower surface of a base, a further reduction in cost can be achieved if the need for such polishing can be eliminated.

Japanese Patent Publication No. 2004-22964 describes making a lower surface in a protruding shape in advance on the assumption that a heat radiating component is to warp. However, in Japanese Patent Publication No. 2004-22964, warpage occurs due to joining of a semiconductor substrate and situations where other members are further disposed on an upper surface of the heat radiating component after joining the semiconductor substrate are not envisaged. Therefore, even though the upper surface of the heat radiating component prior to joining is flat, the upper surface of the heat radiating component after the joining takes on a non-flat shape that is an inverted shape of the protruding shape of the lower surface prior to the joining.

In one embodiment of the present disclosure, a manufacturing method of a semiconductor device includes, in this order: preparing a bottom plate having a lower surface and an upper surface, the upper surface having an outer peripheral part and an inside part that is enclosed by the outer peripheral part and that protrudes more upward than the outer peripheral part, a thickness of the bottom plate in the inside part being greater than a thickness of the bottom plate in the outer peripheral part; joining a frame member to the outer peripheral part of the bottom plate, the frame member having a smaller linear expansion coefficient than the bottom plate; and fixing a semiconductor element to the inside part of the bottom plate. In the preparing the bottom plate, the lower surface of the bottom plate has a reference part positioned lowermost and a recess positioned above the reference part, at least a part of the recess being disposed directly below the outer peripheral part. A depth of the recess in the fixing the semiconductor element is smaller than a depth of the recess in the preparing the bottom plate, as warpage occurs in the bottom plate due to the joining the frame member.

In another embodiment, a manufacturing method of a semiconductor device package includes, in this order: preparing a bottom plate having a lower surface and an upper surface, the upper surface having an outer peripheral part and an inside part that is enclosed by the outer peripheral part and that protrudes more upward than the outer peripheral part, a thickness of the bottom plate in the inside part being greater than a thickness of the bottom plate in the outer peripheral part; and joining a frame member to the outer peripheral part of the bottom plate, the frame member having a smaller linear expansion coefficient than the bottom plate. In the preparing the bottom plate, the lower surface of the bottom plate has a reference part positioned lowermost and a recess positioned above the reference part, at least a part of the recess being disposed directly below the outer peripheral part. A depth of the recess in the fixing the semiconductor element is smaller than a depth of the recess in the preparing the bottom plate, as warpage occurs in the bottom plate due to the joining the frame member.

According to the manufacturing method of a semiconductor device and the manufacturing method of a semiconductor device package described above, an inside part of an upper surface of a bottom plate is less likely to deform due to joining of a frame member and, at the same time, the need for a planarizing process of a lower surface after joining of the frame member can be eliminated.

DETAILED DESCRIPTION

Figure 1:
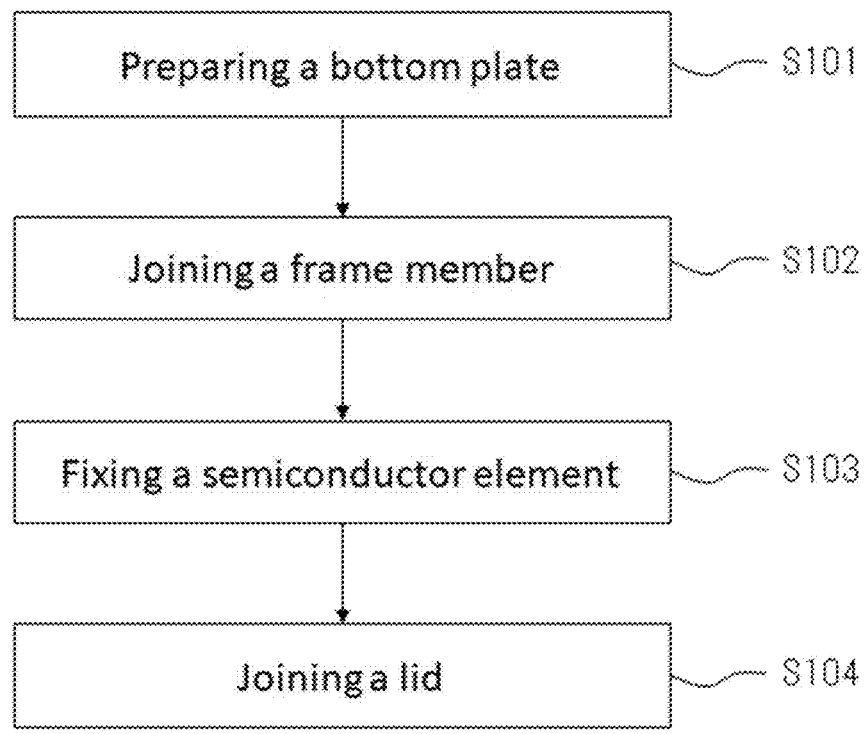
FIG. 1 is a flow chart schematically showing a manufacturing method of a semiconductor device and a manufacturing method of a semiconductor device package according to an embodiment.

The embodiments described below are merely examples for giving concrete shapes to the technical concepts of the present invention. The present invention is not limited to the following embodiment. In addition, it should be noted that sizes, positional relationships, and the like of members shown in the drawings may sometimes be exaggerated in order to facilitate understanding. Furthermore, in principle, the same names and reference characters denote equal or identical members and overlapping descriptions will be omitted as appropriate.

FIG. 1 is a flow chart schematically showing a manufacturing method of a semiconductor device and a manufacturing method of a semiconductor device package according to an embodiment. The manufacturing method of a semiconductor device package according to the present embodiment includes, in this order, a step S101 of preparing a bottom plate and a step S102 of joining a frame member. The manufacturing method of a semiconductor device according to the present embodiment further subsequently includes a step S103 of fixing a semiconductor element. In addition, the manufacturing method of a semiconductor device may include a step S104 of joining a lid after the step S103. FIGS. 2A to 2D are schematic sectional views showing the respective steps. As shown in FIGS. 2A to 2D, although warpage occurs in a bottom plate 10 when a frame member 20 is joined to the bottom plate 10, because a thickness of the bottom plate 10 in an outer peripheral part 12a where the frame member 20 is to be joined is less than a thickness of the bottom plate 10 in an inside part 12b, the warpage mainly occurs in a portion of the outer peripheral part 12a.

Because the inside part 12b is less likely to warp, the flatness of a surface to which a semiconductor element 30 is fixed can be maintained. In addition, because a recess 11a is formed in advance in a portion that protrudes due to the warpage on a lower surface 11 of the bottom plate 10, the lower surface 11 of the bottom plate 10 can be brought closer to a flat surface in a state in which warpage has occurred. Therefore, the need for a planarizing process of the lower surface 11 after joining of the bottom plate 10 and the frame member 20 can be eliminated. Hereinafter, each step will be described in detail.

Bottom Plate Preparation Step

Figure 2A:
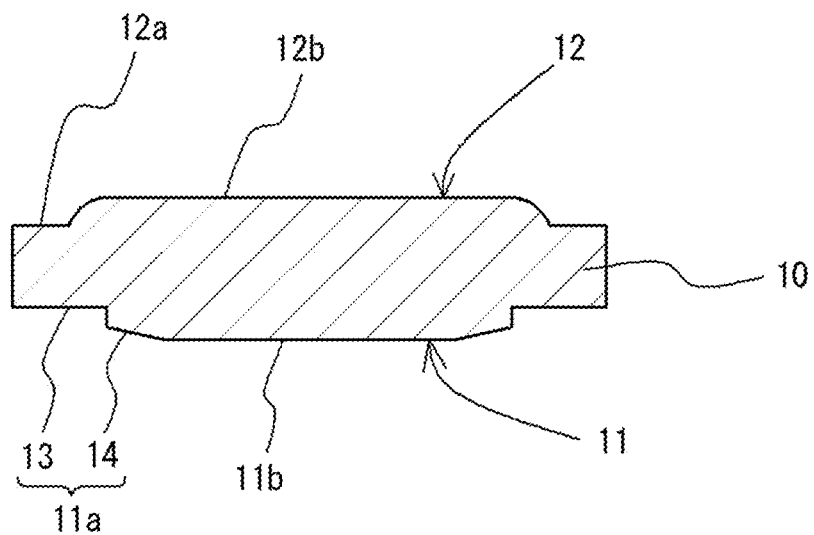
FIG. 2A is a schematic sectional view showing a bottom plate preparation step.

First, as shown in FIG. 2A, the bottom plate 10 is prepared. The bottom plate 10 has the lower surface 11 and an upper surface 12. The upper surface 12 has the outer peripheral part 12a and the inside part 12b. The inside part 12b is enclosed by the outer peripheral part 12a and protrudes more upward than the outer peripheral part. A thickness of the bottom plate 10 in the inside part 12b is greater than a thickness of the bottom plate 10 in the outer peripheral part 12a. The lower surface 11 has a reference part 11b positioned lowermost and a recess 11a positioned above the reference part 11b. The recess 11a is disposed directly below the outer peripheral part 12a. It should be noted that, in the present specification, a surface on a side at which a semiconductor element (to be described later) is disposed is referred to as the upper surface 12 and a surface on an opposite side thereof is referred to as the lower surface 11. In addition, a direction from the lower surface 11 toward the upper surface 12 is referred to as upward and a direction from the upper surface 12 toward the lower surface 11 is referred to as downward.

The recess 11a can be formed at a location that is expected to protrude due to joining of the frame member 20 in a depth that enables a protrusion amount of the location to be reduced. The location expected to protrude can be specified by, for example, joining the frame member 20 to the bottom plate 10 of which the lower surface 11 has been made a flat surface and measuring a distribution of protrusion amounts of the lower surface after the joining. Accordingly, protrusion amounts can also be estimated. Alternatively, the location expected to protrude can be specified by a simulation. As shown in FIG. 2A, a position of the recess 11a is not limited to directly below the outer peripheral part 12a and a part of the recess 11a may be formed directly below the inside part 12b. In this case, the recess 11a is preferably disposed so that the thickness of the inside part 12b does not become smaller than the thickness of the outer peripheral part 12a.

Figure 3A:
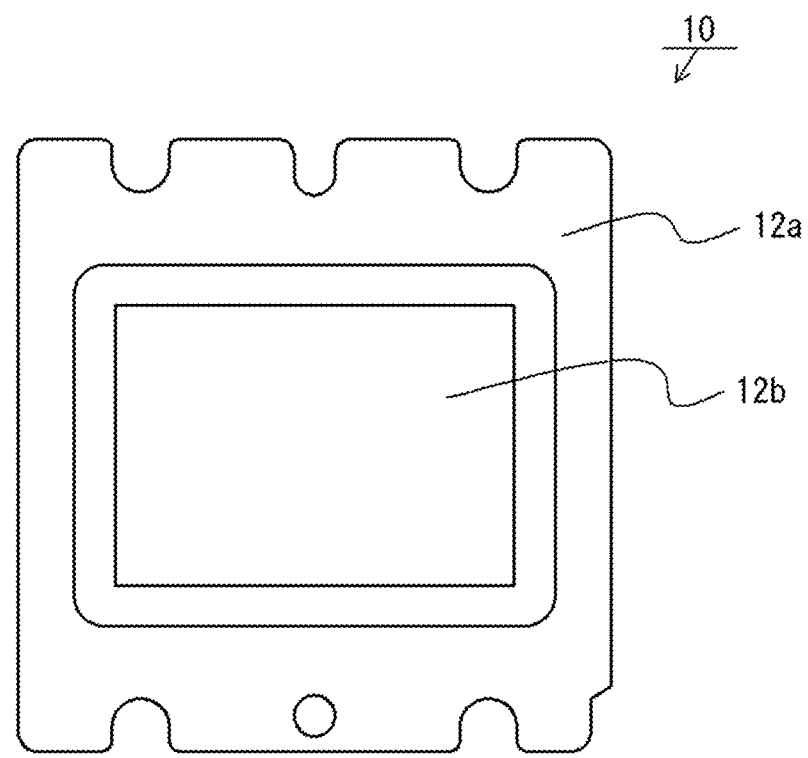
FIG. 3A is a schematic plan view of a bottom plate according to an embodiment.
Figure 3B:
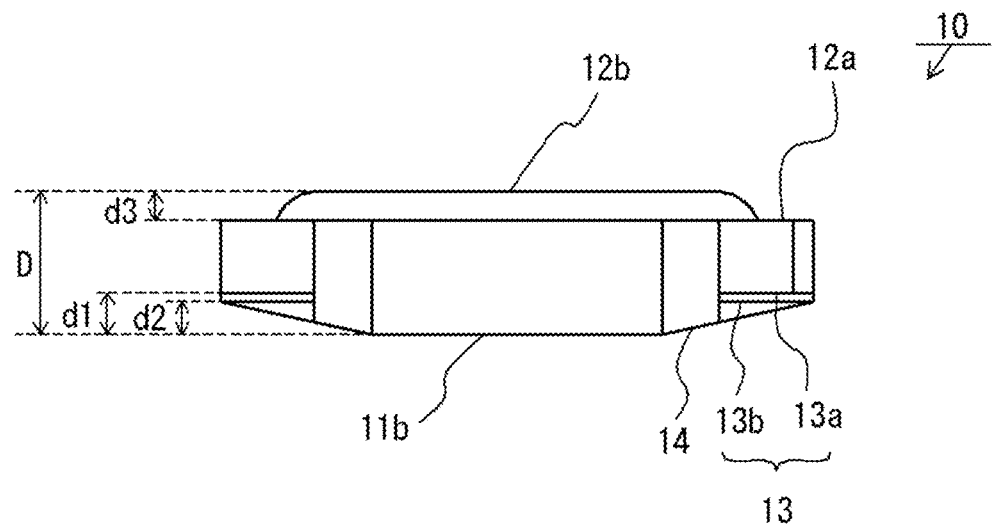
FIG. 3B is a schematic front view of the bottom plate according to an embodiment.
Figure 3C:
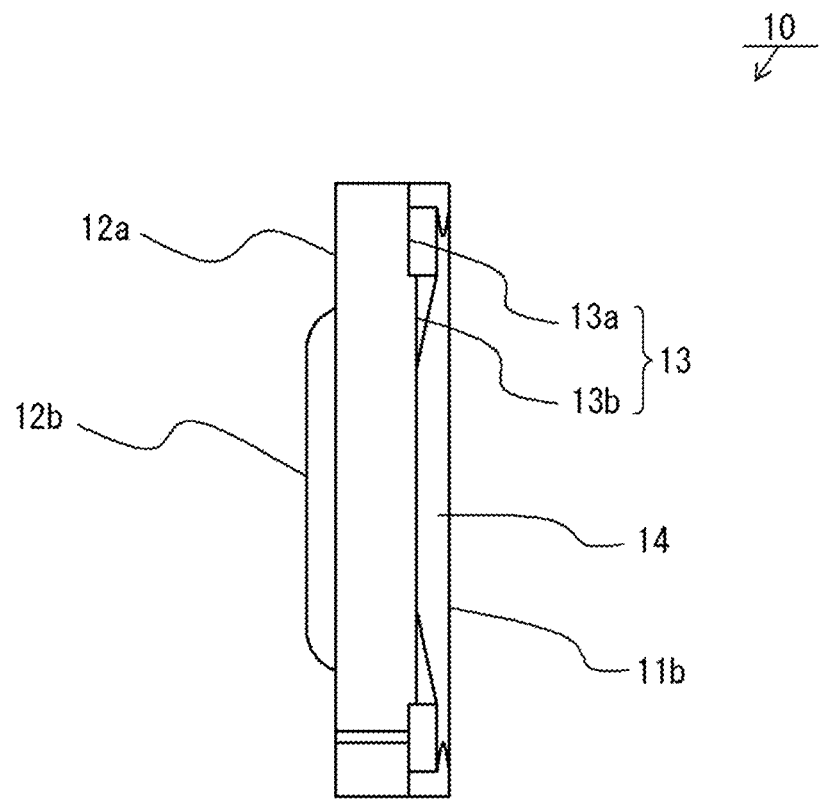
FIG. 3C is a schematic right side view of the bottom plate according to an embodiment.
Figure 3D:
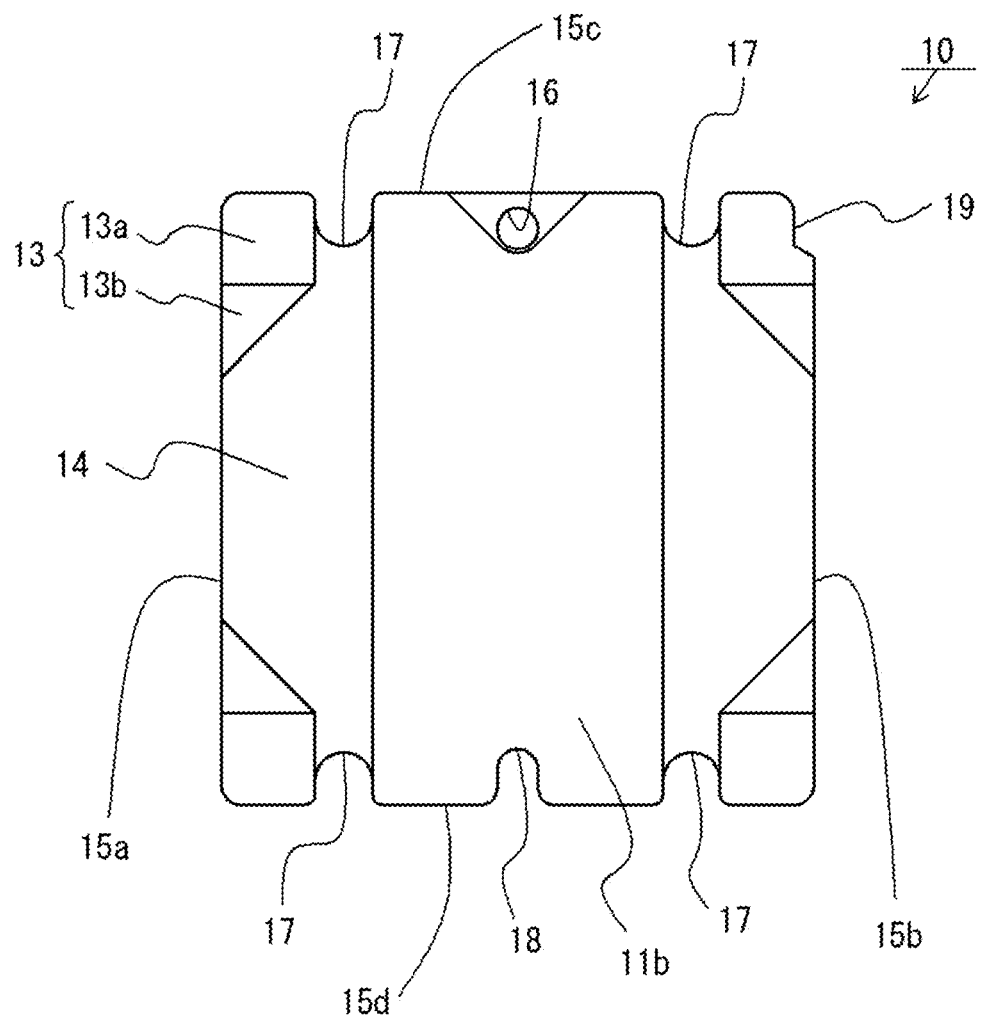
FIG. 3D is a schematic bottom view of the bottom plate according to an embodiment.
Figure 3E:
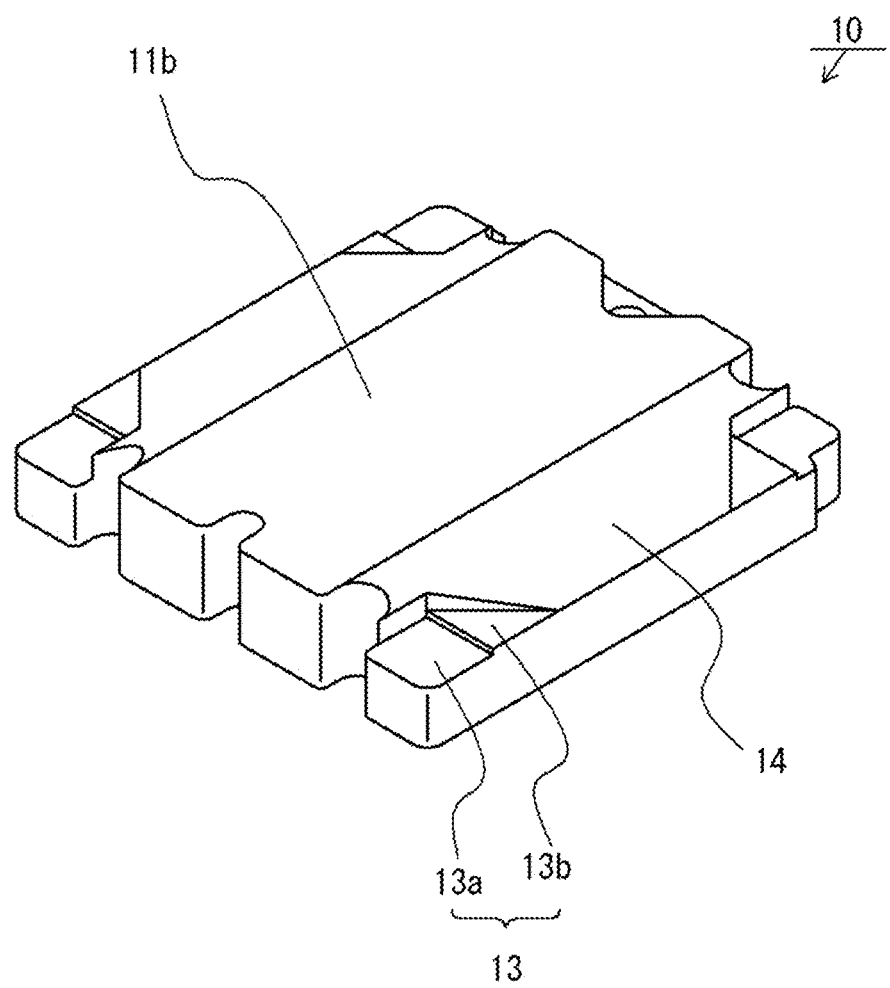
FIG. 3E is a schematic perspective view of the bottom plate according to an embodiment.

A more detailed structure of the bottom plate 10 will now be described with reference to FIGS. 3A to 3E. FIG. 3A is a plan view, FIG. 3B is a front view, FIG. 3C is a right side view, and FIG. 3D is a bottom view. FIG. 3E is a perspective view including a bottom surface, a right side surface, and a rear surface.

As shown in FIGS. 3A to 3E, the upper surface 12 of the bottom plate 10 has the outer peripheral part 12a and the inside part 12b, and the lower surface 11 has the reference part 11b, and a parallel surface 13 and an inclined surface 14 as recesses. As shown in FIG. 3D, the lower surface 11 of the bottom plate 10 has a shape like a square and includes a first side 15a and a second side 15b that oppose each other and a third side 15c and a fourth side 15d that oppose each other. The reference part 11b is provided in a shape that connects the third side 15c and the fourth side 15d. As the recesses, four first parallel surfaces 13a, four second parallel surfaces 13b, and two inclined surfaces 14 are provided. Each of the first parallel surfaces 13a is respectively disposed at four corners of the lower surface 11, and each of the second parallel surfaces 13b is respectively disposed adjacent to each of the first parallel surfaces 13a. The first parallel surfaces 13a have a shape like a square, and the second parallel surfaces 13b have a shape like an isosceles triangle that shares a side with the square shape of the first parallel surfaces 13a. Two first parallel surfaces 13a and two second parallel surfaces 13b are disposed along the first side 15a, and two first parallel surfaces 13a and two second parallel surfaces 13b are disposed along the second side 15b. One of the two inclined surfaces 14 is disposed in a shape that connects the first side 15a and the reference part 11b while the other inclined surface 14 is disposed in a shape that connects the second side 15b and the reference part 11b. The inclined surfaces 14 are also respectively shaped so as to connect the reference part 11b with the first parallel surface 13a and the second parallel surface 13b. As shown in FIG. 3B, a depth d1 of the first parallel surface 13a is greater than a depth d2 of the second parallel surface 13b. In the inclined surface 14, a portion matching the first side 15a (or the second side 15b) is deepest, and the depth here is d2, which is the same as that of the second parallel surface 13b. The inclined surface 14 is a shape that connects the deepest portion to the reference part 11b at a constant degree of inclination.

The lower surface 11 is shaped as a square having rounded corners and having a plurality of cutout shapes 17, 18, and 19. Four cutout shapes 17 disposed adjacent to the inclined surface 14 are portions into which a screw for screwing is inserted. One cutout shape 18 disposed adjacent to the reference part 11b is a portion into which a positioning pin is inserted. A through-hole 16 is a hole into which another positioning pin is inserted. As shown in FIG. 3E, a periphery of the through-hole 16 may have a recessed shape. The lower surface 11 also has the cutout shape 19 in a corner at which the second side 15b and the third side 15c intersect. The cutout shape 19 is used to determine an orientation of installation when fixing the semiconductor device to a heat sink or the like by screwing or the like.

As shown in FIG. 3B, the inside part 12b and the reference part 11b are preferably parallel to each other. Accordingly, because the bottom plate 10 in a portion where the inside part 12b and the reference part 11b oppose each other can be given a uniform thickness, an imbalance in stress is less likely to occur in this portion and, consequently, warpage is less likely to occur. It should be noted that "parallel" as used in the present specification not only means parallel in a strict sense but also includes a range deviated by two degrees from strictly parallel. In addition, as shown in FIG. 3B, while a boundary between the inside part 12b and the outer peripheral part 12a may be an inclined surface, in this case, the inside part 12b may be considered a portion that excludes the inclined surface and that need only be parallel to the reference part 11b. While the reference part 11b may be a curved surface, the reference part 11b is preferably a flat surface as shown in FIG. 3B so as to stabilize the bottom plate 10 when joining the frame member 20.

The recess 11a can have the parallel surface 13 and the inclined surface 14. The parallel surface 13 is a surface that is parallel to the reference part 11b and the inclined surface 14 is a surface that is inclined relative to the reference part 11b. The parallel surface 13 is preferably disposed at a position separated from the reference part 11b while the inclined surface 14 is preferably disposed at a position that connects the parallel surface 13 and the reference part 11b. As shown in FIG. 2A to 2D, when providing the parallel surface 13 creates a level difference, the parallel surface 13 is likely to leave a trace after the frame member 20 is joined. On the other hand, because the inclined surface 14 is less likely to leave a trace, by disposing the inclined surface 14 adjacent to the reference part 11b, the reference part 11b and a periphery thereof can be more readily made close to a flat surface after the frame member 20 is joined. The parallel surface 13 is preferably disposed so as to avoid the portion directly below the inside part 12b. Accordingly, heat of the semiconductor element 30 fixed to the inside part 12b can be efficiently transferred to a heat sink or the like. In addition, because only providing the inclined surface 14 may result in insufficient depth to prevent excessive protrusion after the joining of the frame member 20, the parallel surface 13 is preferably provided in addition to the inclined surface 14. Alternatively, an inclined surface that is even deeper than the inclined surface 14 may be provided instead of the parallel surface 13.

As shown in FIG. 3D, the lower surface 11 of the bottom plate 10 can have a shape like a square. Although the lower surface 11 is shaped as a square having rounded corners and having a plurality of cutout shapes 17, 18, and 19 in FIG. 3D, such shapes are included in the phrase "shape like a square" as used in the present specification. When the lower surface 11 has a shape like a square, portions that are likely to protrude downward due to warpage caused by joining of the frame member 20 are the four corners. Therefore, the parallel surface 13 is preferably disposed at the four corners of the lower surface 11. As shown in FIGS. 2B to 3E, the parallel surface 13 may include the first parallel surface 13a and the second parallel surface 13b with respectively different depths. In this case, preferably, in order to make the four corners the deepest, the depth d1 of the first parallel surface 13a is set larger than the depth d2 of the second parallel surface 13b and the first parallel surface 13a is disposed at the four corners.

The depth d1 can be set to, for example, 0.01 to 0.1 mm. The depth d2 can be set to, for example, 0.01 to 0.05 mm. A difference between the depth d1 and the depth d2 can be set to, for example, 0.01 mm or more. The difference between the depth d1 and the depth d2 is preferably set to 0.03 mm or less so that a level difference is less likely to remain after joining of the frame member 20.

As will be described later, a direction in which warpage is more likely to occur can be adjusted with the structure of the frame member 20. For example, when warpage is less likely to occur in a vertical direction but warpage is more likely to occur in a horizontal direction in FIG. 3D, the reference part 11b is preferably provided in a shape that connects the third side 15c and the fourth side 15d. In addition, in this case, because warpage occurs roughly bilaterally symmetrically relative to the reference part 11b, the parallel surface 13 and the inclined surface 14 are preferably bilaterally symmetrically disposed relative to the reference part 11b. As described above, the reference part 11b and the recess can be disposed at appropriate positions in accordance with a direction in which warpage is likely to occur.

Figure 4:
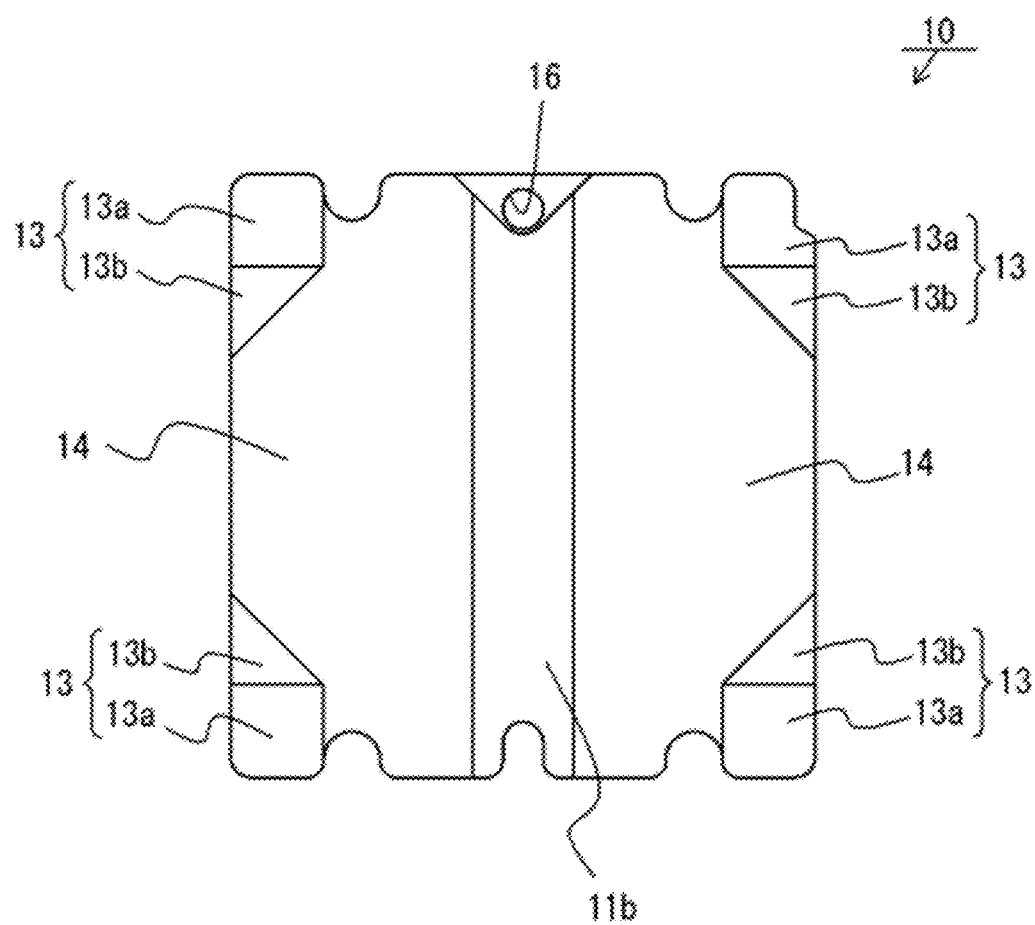
FIG. 4 is a schematic bottom view showing a first modification of the bottom plate.

First to seventh modifications of the bottom plate 10 are shown in FIGS. 4 to 10B. FIG. 4 is a schematic bottom view showing the first modification of the bottom plate 10. Although a width in the horizontal direction in FIG. 3D of the reference part 11b is larger than that of the inclined surface 14 in the bottom plate 10 shown in FIG. 3D, the width in the horizontal direction of the reference part 11b can be made smaller as shown in FIG. 4. Because warpage occurs over the entire bottom plate 10, in order to make the lower surface of the bottom plate 10 even flatter in a state where warpage has occurred, conceivably, it is more preferable to provide surfaces with a same height in small sizes and increase a ratio of inclined surfaces and surfaces with different heights as compared to providing surfaces with a same height in large sizes. Therefore, the reference part 11b is preferably provided in a smaller size.

Figure 5:
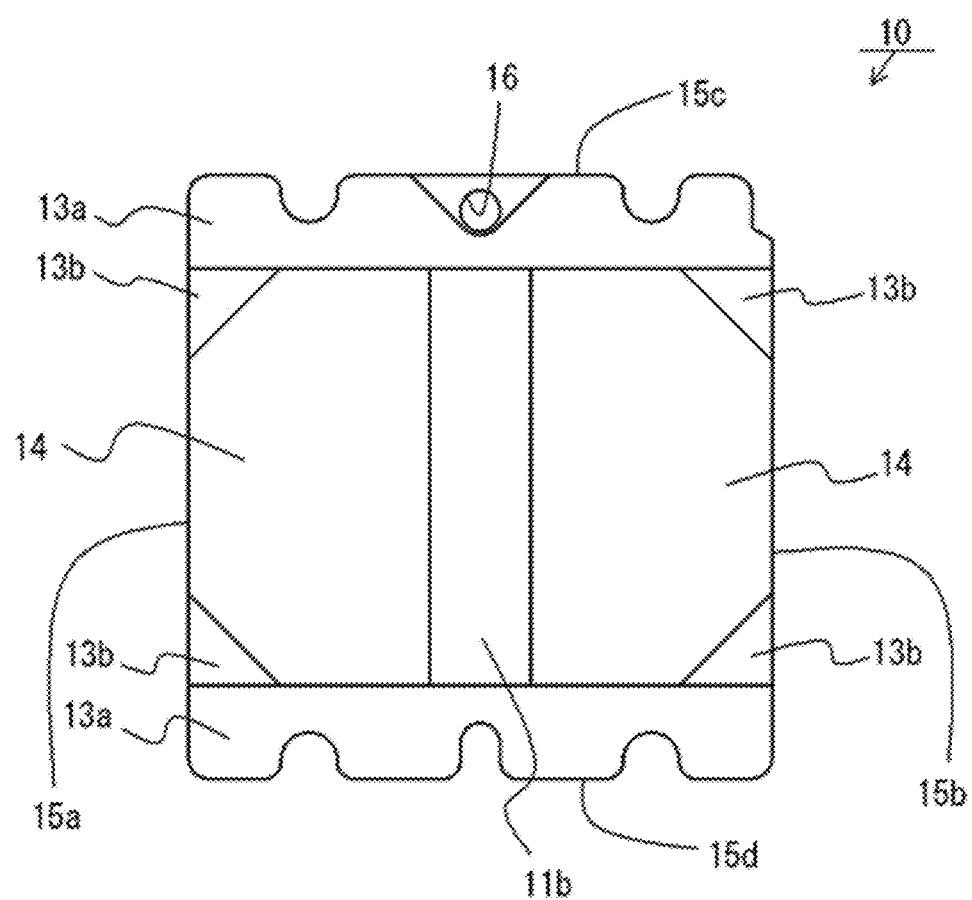
FIG. 5 is a schematic bottom view showing a second modification of the bottom plate.

FIG. 5 is a schematic bottom view showing the second modification of the bottom plate 10. As shown in FIG. 5, the bottom plate 10 can have the first parallel surface 13a that extends along the third side 15c and that connects the first side 15a and the second side 15b and the first parallel surface 13a that extends along the fourth side 15d and that connects the first side 15a and the second side 15b. In this manner, parallel surfaces need not necessarily be divided into four corners.

Figure 6:
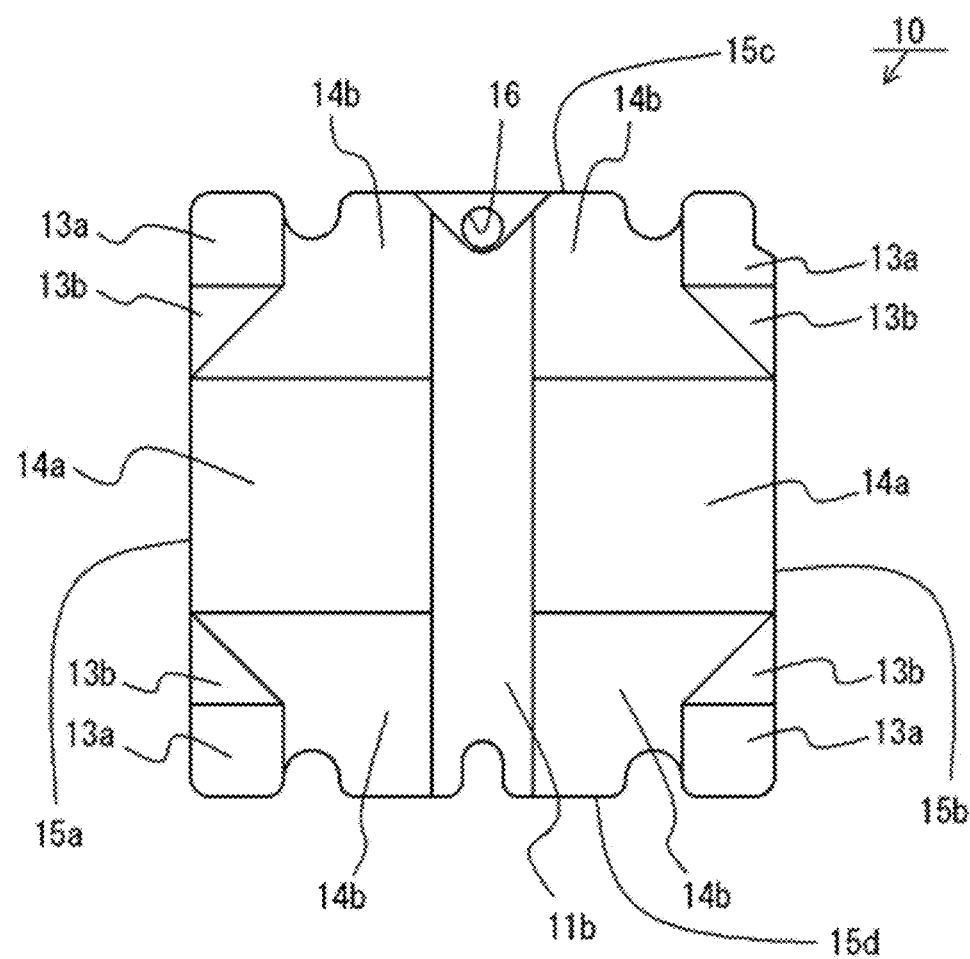
FIG. 6 is a schematic bottom view showing a third modification of the bottom plate.

FIG. 6 is a schematic bottom view showing the third modification of the bottom plate 10. The bottom plate 10 according to the third modification has two first inclined surfaces 14a that respectively connect the reference part 11b to the first side 15a and the second side 15b and four second inclined surfaces 14b that respectively connect the reference part 11b to the first parallel surface 13a and the second parallel surface 13b. In this manner, the bottom plate 10 may have the first inclined surface 14a and the second inclined surface 14b as inclined surfaces.

An inclination angle of the first inclined surface 14a is smaller than an inclination angle of the second inclined surface 14b. As described earlier, in order to make the lower surface of the bottom plate 10 even flatter in a state where warpage has occurred, conceivably, it is preferable to provide surfaces with various heights. Therefore, it is preferable to provide two or more inclined surfaces with different inclination angles and, accordingly, the lower surface of the bottom plate 10 can be made even flatter in a state where warpage has occurred.

Figure 7:
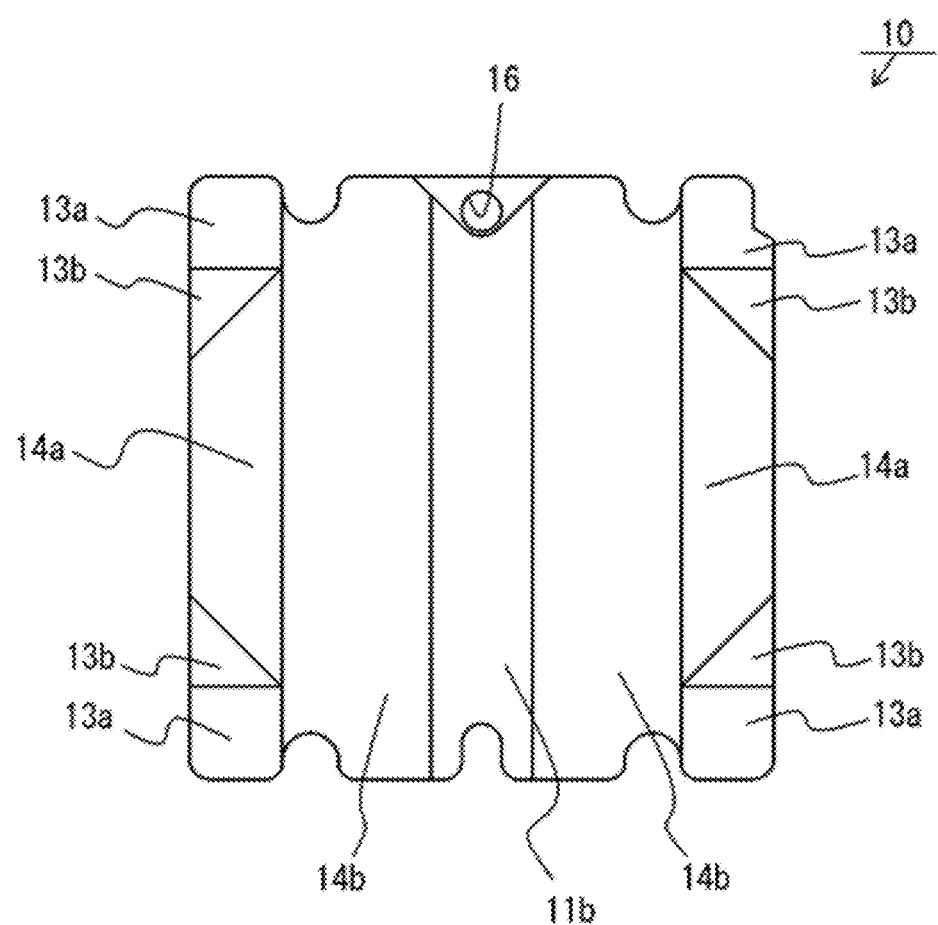
FIG. 7 is a schematic bottom view showing a fourth modification of the bottom plate.

FIG. 7 is a schematic bottom view showing the fourth modification of the bottom plate 10. The bottom plate 10 according to the fourth modification has the first inclined surface 14a that connects parallel surfaces (second parallel surfaces 13b) that are adjacent to each other and the second inclined surface 14b that connects the first inclined surface 14a to the reference part 11b. The inclination angle of the first inclined surface 14a is smaller than the inclination angle of the second inclined surface 14b. When forming the bottom plate 10 with a press, an outer peripheral part of the bottom plate 10 tends to be readily recessed. Therefore, by disposing the first inclined surface 14a with the smaller inclination angle in the outer peripheral part, the outer peripheral part can be prevented from being excessively recessed in combination with the recess during pressing.

Figure 8A:
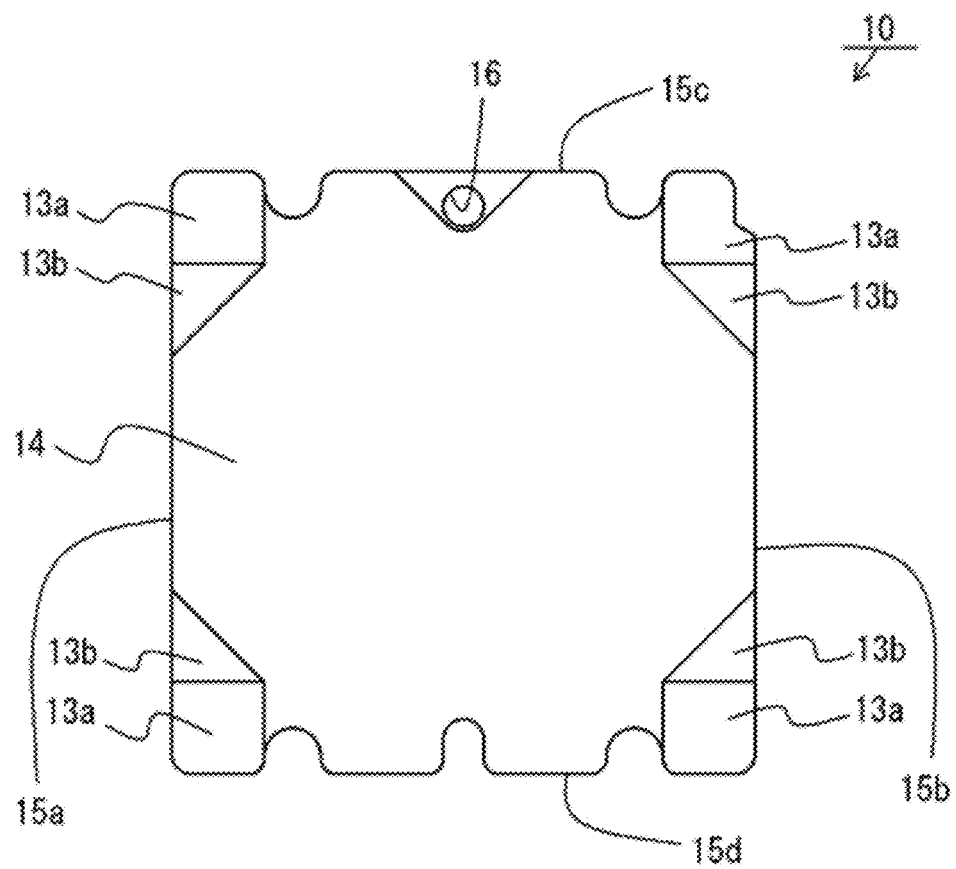
FIG. 8A is a schematic bottom view showing a fifth modification of the bottom plate.
Figure 8B:
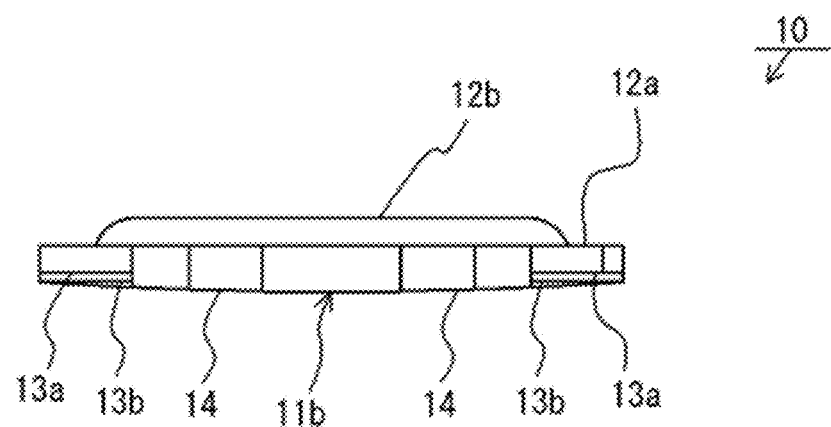
FIG. 8B is a schematic front view showing the fifth modification of the bottom plate.

FIG. 8A is a schematic bottom view showing the fifth modification of the bottom plate 10, and FIG. 8B is a schematic front view thereof. The bottom plate 10 according to the fifth modification has a curved inclined surface 14. As shown in FIG. 8B, in the inclined surface 14, a linear portion that passes through a central part of the bottom plate 10 and that is parallel to the first side 15a is a portion positioned lowermost or, in other words, the reference part 11b. The inclined surface 14 respectively connects the reference part 11b to the first side 15a and the second side 15b with curved surfaces. As described earlier, in order to make the lower surface of the bottom plate 10 even flatter in a state where warpage has occurred, conceivably, it is preferable to provide surfaces with various heights. Therefore, providing such curved surfaces enables the lower surface of the bottom plate 10 to be made even flatter.

Figure 9A:
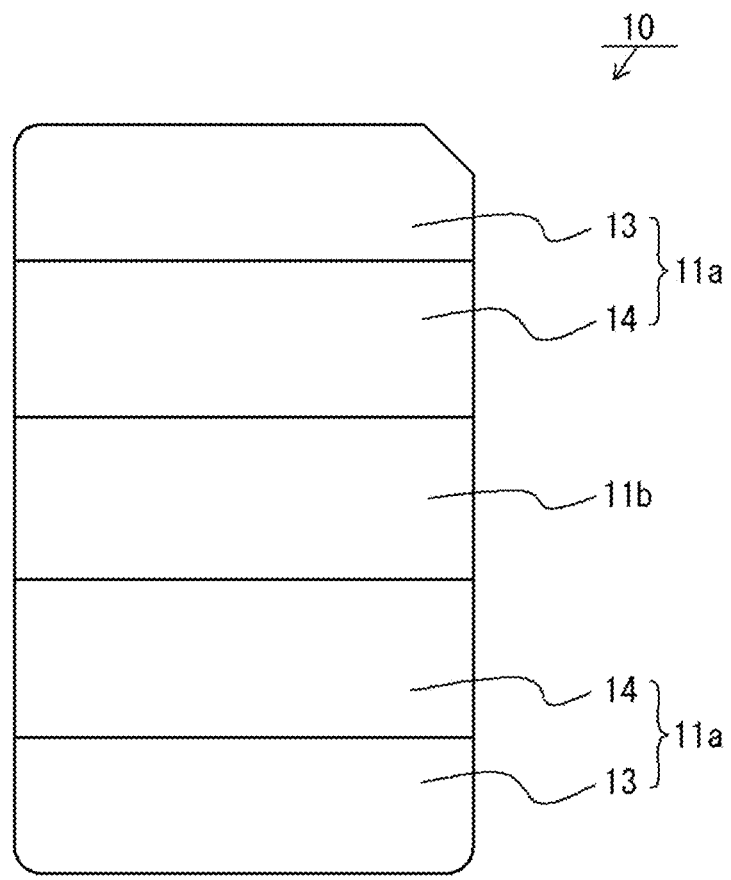
FIG. 9A is a schematic bottom view showing a sixth modification of the bottom plate.
Figure 9B:
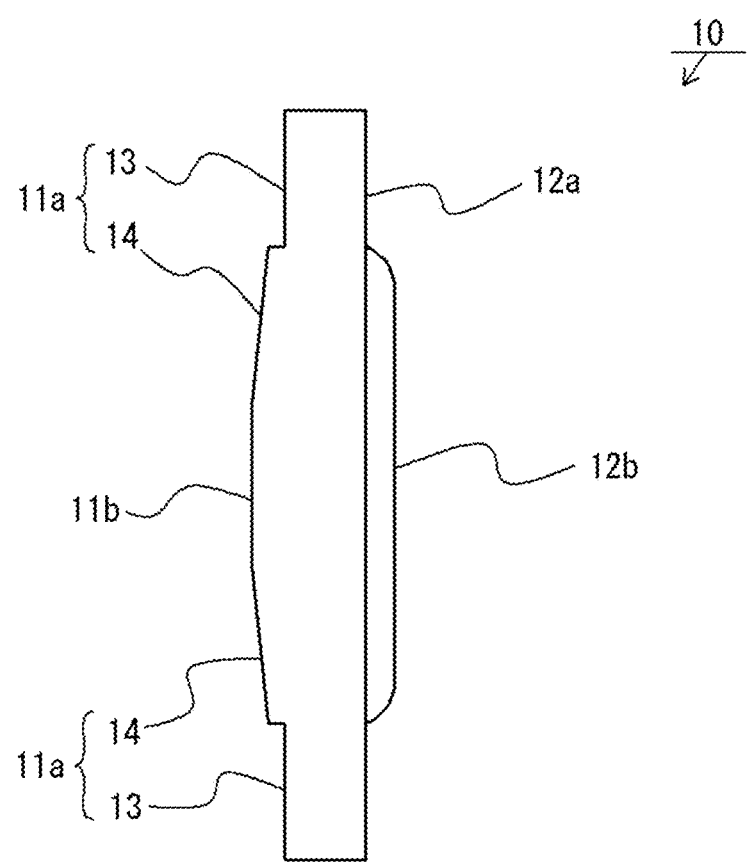
FIG. 9B is a schematic left side view showing the sixth modification of the bottom plate.

FIG. 9A is a schematic bottom view showing the sixth modification of the bottom plate 10, and FIG. 9B is a schematic left side view thereof. The bottom plate 10 shown in FIGS. 9A and 9B is shaped longer in the vertical direction than the bottom plate 10 shown in FIGS. 3A to 3E. Such a shape is more likely to warp in a longitudinal direction and less likely to warp in a traverse direction. Therefore, for example, the reference part 11b is made in a shape that connects both long sides of the lower surface with each other, the parallel surface 13 along both short sides is disposed, and the inclined surface 14 is disposed between the reference part 11b and the parallel surface 13.

Figure 10A:
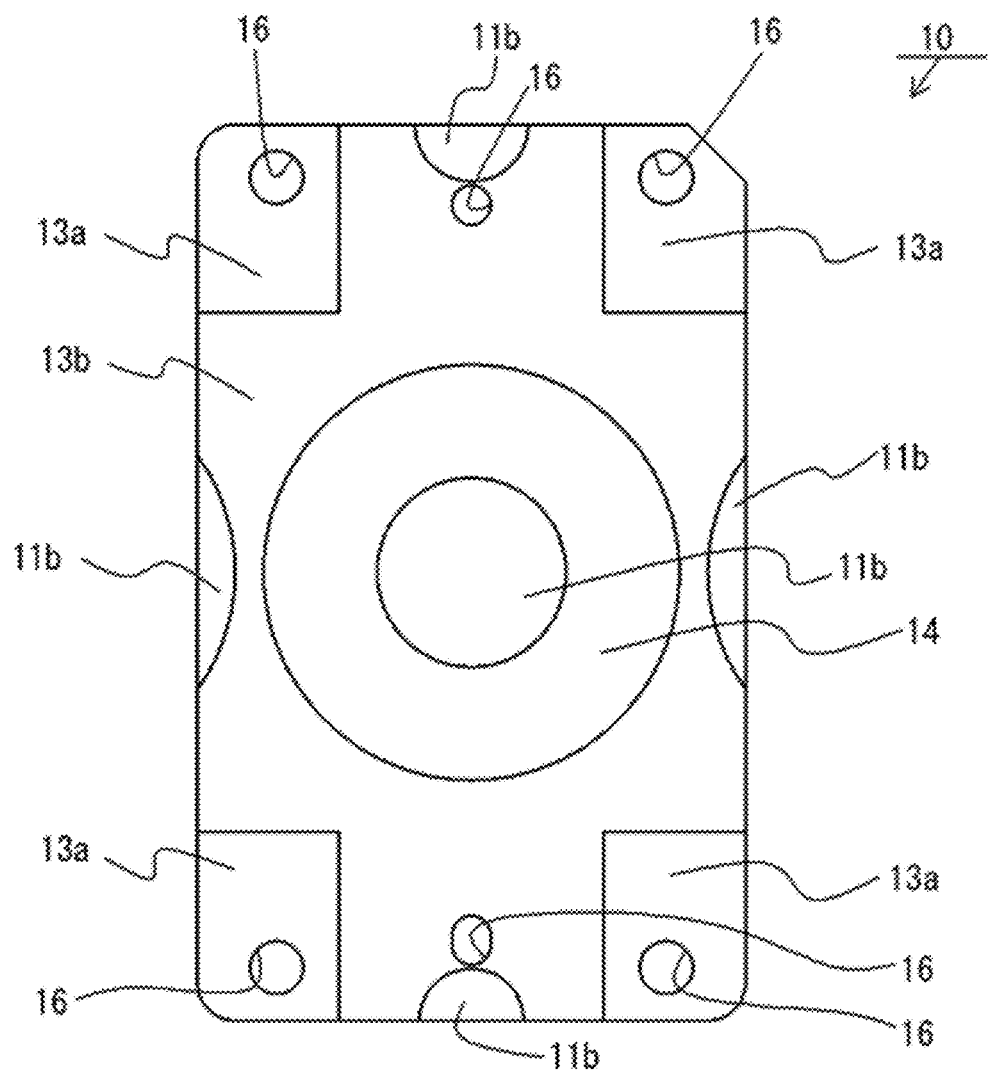
FIG. 10A is a schematic bottom view showing a seventh modification of the bottom plate.
Figure 10B:
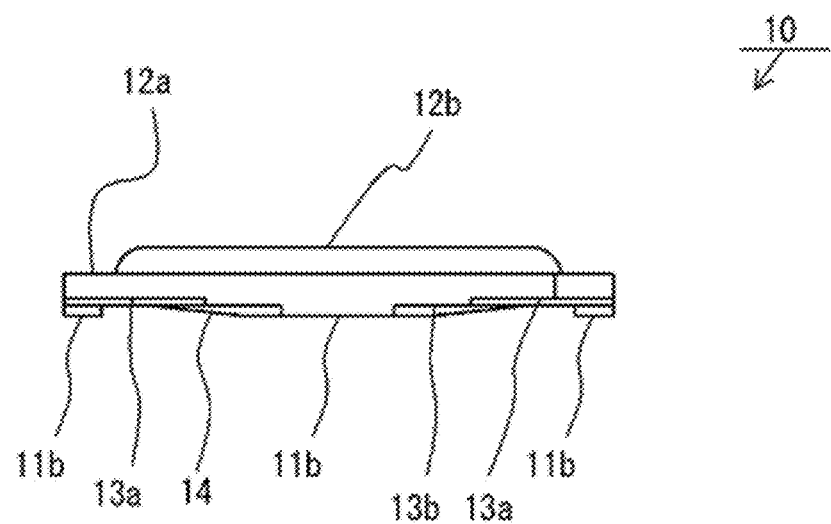
FIG. 10B is a schematic front view showing the seventh modification of the bottom plate.

FIG. 10A is a schematic bottom view showing the seventh modification of the bottom plate 10, and FIG. 10B is a schematic front view thereof. The bottom plate 10 according to the seventh modification has a plurality of reference parts 11b. Four through-holes 16 formed in the four corners of the bottom plate 10 are portions into which screws for screwing are inserted and remaining two through-holes are holes into which positioning pins are inserted. In addition, the bottom plate 10 has one second parallel surface 13b that connects first parallel surfaces 13a respectively formed in the four corners. The larger the size of the bottom plate 10, the more likely portions between corners are to be lifted upwards, resulting in complicated warpage. Therefore, in such a case, as shown in FIGS. 10A and 10B, the reference part 11b is preferably disposed in portions along the sides between the corners in addition to the reference part 11b in a central part. Accordingly, an effect of making the portions along the sides between the corners less likely to be lifted upward can be expected. Alternatively, a level difference of two or more steps may be provided instead of the inclined surface 14.

The lower surface 11 may be given an arch-like sectional shape protruding downward as in the fifth modification shown in FIGS. 8A and 8B. In this case, the reference part 11b is a portion positioned lowermost in the arch shape and other portions constitute the inclined surface 14. Even in this case, the parallel surfaces 13 that are deeper than the inclined surface 14 are preferably disposed in the four corners of the lower surface 11.

The bottom plate 10 is a member on which the semiconductor element 30 and the like can be mounted. The lower surface 11 of the bottom plate 10 can be thermally connected to a heat sink or the like. Accordingly, heat of the semiconductor element 30 can be released to the heat sink or the like. While a ceramic material or a metal material can be used for the bottom plate 10, a metal material is preferably used in order to improve heat radiation. Examples of the metal material include aluminum, an aluminum alloy, iron, an iron alloy, copper, and a copper alloy. In the bottom plate preparation step, a planarizing process may be performed on the inside part 12b, the reference part 11b, and the like of the bottom plate 10. Examples of the planarizing process include polishing and rolling. The recess 11a can be formed using, for example, a press.

Frame Member Joining Step

Figure 2B:
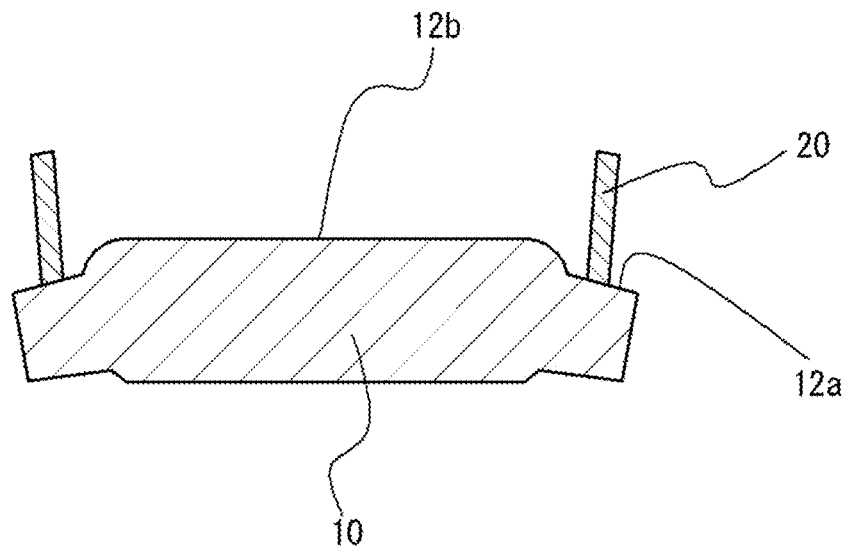
FIG. 2B is a schematic sectional view showing a frame member joining step.

Next, as shown in FIG. 2B, the frame member 20 is joined to the outer peripheral part 12a of the bottom plate 10. A linear expansion coefficient of the frame member 20 is smaller than a linear expansion coefficient of the bottom plate 10. Joining the frame member 20 creates warpage that causes the bottom plate 10 to protrude upward. Accordingly, a depth of the recess 11a after joining the frame member 20 becomes smaller than a depth of the recess 11a provided on the lower surface 11 of the bottom plate 10 in the bottom plate preparation step.

Figure 11A:
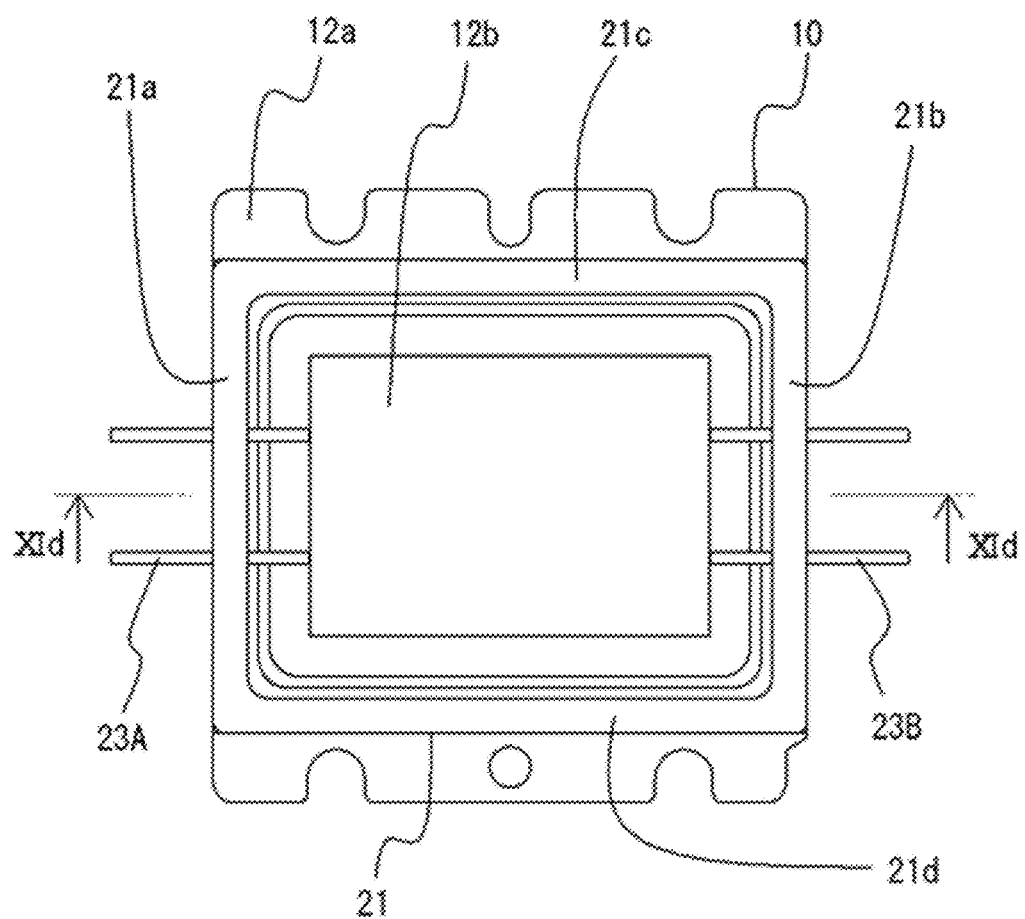
FIG. 11A is a schematic plan view showing a semiconductor device package according to an embodiment.
Figure 11B:
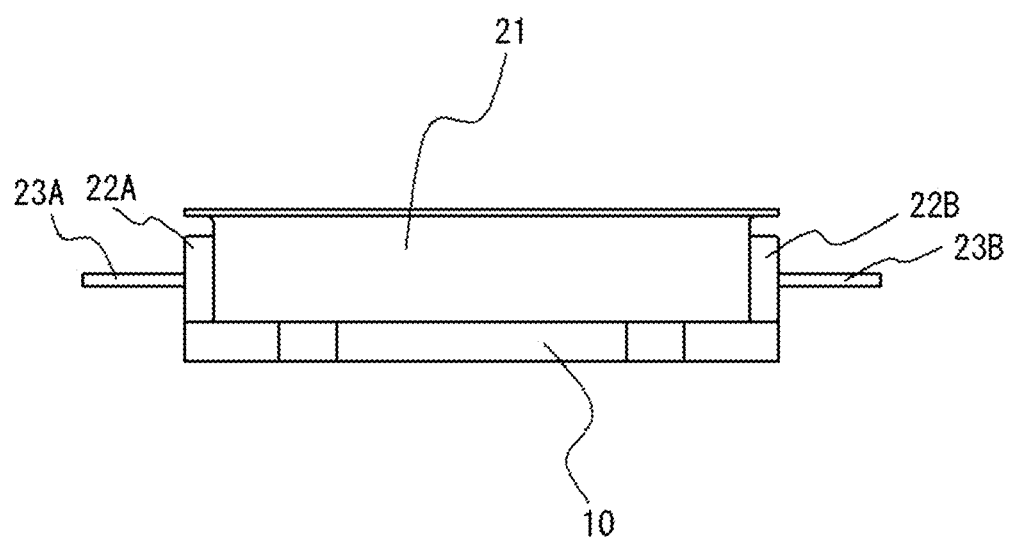
FIG. 11B is a schematic front view showing the semiconductor device package according to an embodiment.
Figure 11C:
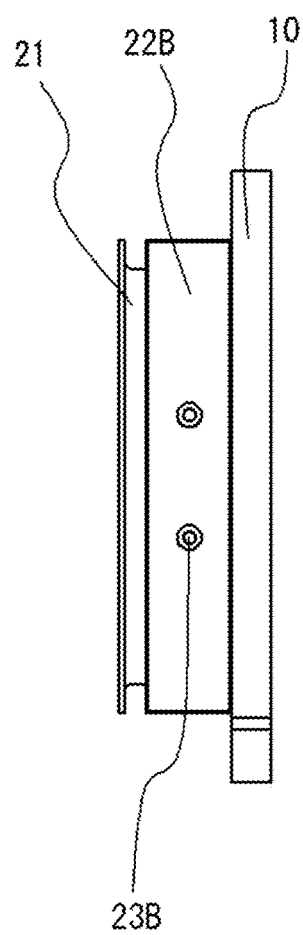
FIG. 11C is a schematic right side view showing the semiconductor device package according to an embodiment.
Figure 11D:
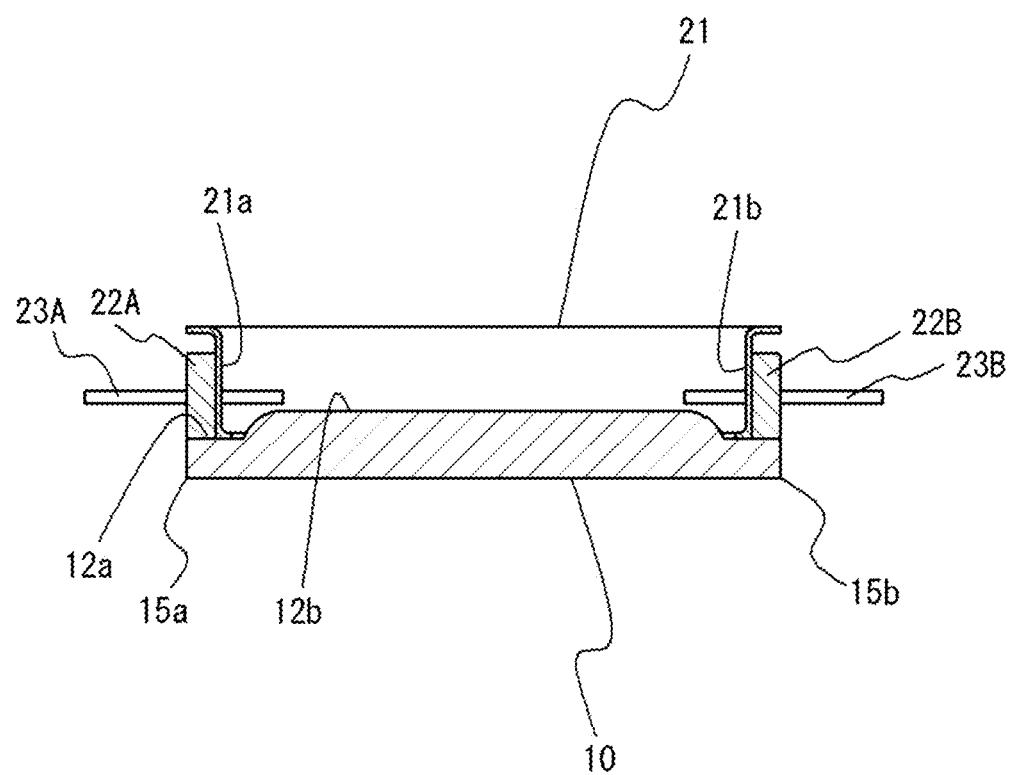
FIG. 11D is a schematic sectional view taken along line XId-XId in FIG. 11A.

A semiconductor device package can be manufactured by the bottom plate preparation step and the frame member joining step. A more detailed structure of the frame member will now be described with reference to FIGS. 11A to 11D. FIGS. 11A to 11D are diagrams showing a state where the frame member is joined to the bottom plate 10 or, in other words, diagrams showing a semiconductor device package. FIG. 11A is a plan view, FIG. 11B is a front view, FIG. 11C is a right side view, and FIG. 11D is a sectional view taken along XId-XId in FIG. 11A. It should be noted that the recess 11a and the reference part 11b on the lower surface 11 of the bottom plate 10 are omitted and not illustrated in FIGS. 11A to 11D.

As shown in FIGS. 11A to 11D, the frame member can have a frame 21 and a plate. The frame 21 has a shape like square in a top view and includes a first wall 21a and a second wall 21b that oppose each other and a third wall 21c and a fourth wall 21d that oppose each other. The plate has a first plate 22A that is joined to the first wall 21a and a second plate 22B that is joined to the second wall 21b. The first wall 21a is positioned on a side of the first side 15a of the bottom plate 10 and the second wall 21b is positioned on a side of the second side 15b of the bottom plate 10. The frame member further has a first lead terminal 23A that is disposed so as to penetrate the first wall 21a and the first plate 22A and a second lead terminal 23B that is disposed so as to penetrate the second wall 21b and the second plate 22B. The first lead terminal 23A and the second lead terminal 23B are respectively fixed to the first plate 22A and the second plate 22B via an insulating member such as glass.

Figure 12:
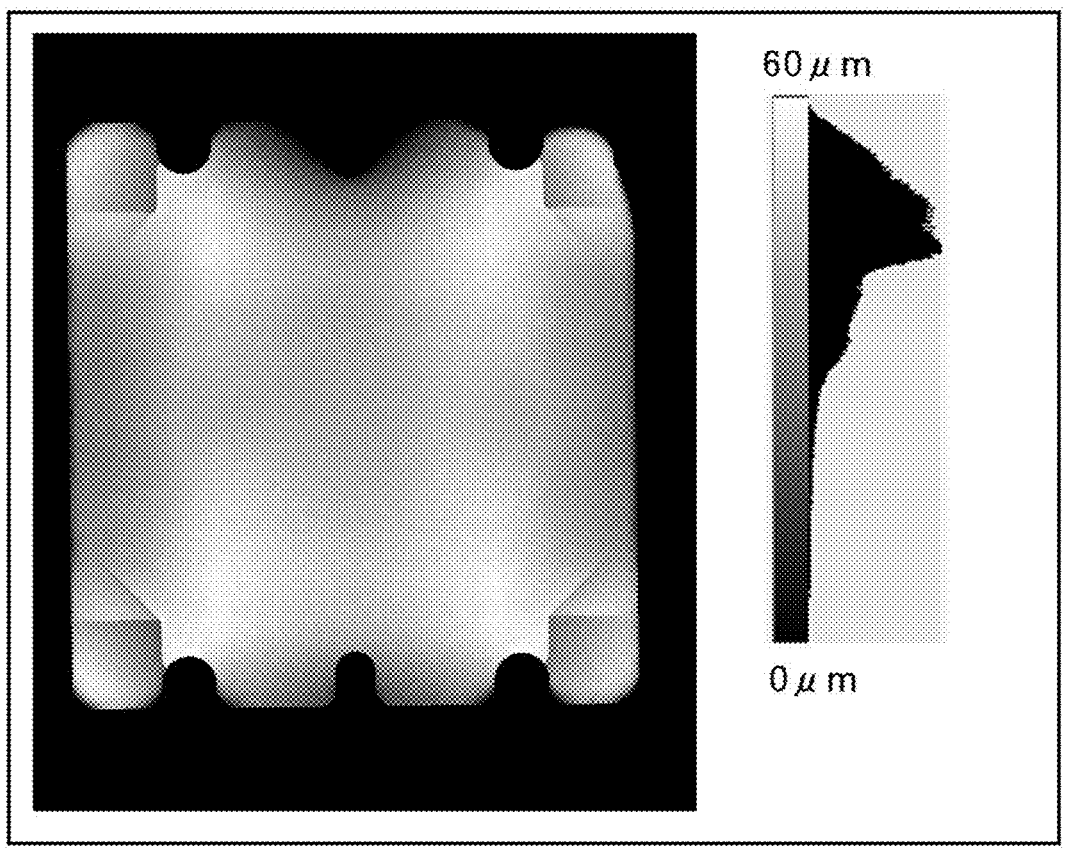
FIG. 12 is a diagram showing a protrusion amount distribution of a lower surface of a bottom plate after the frame member joining step in a validation example.
Figure 13:
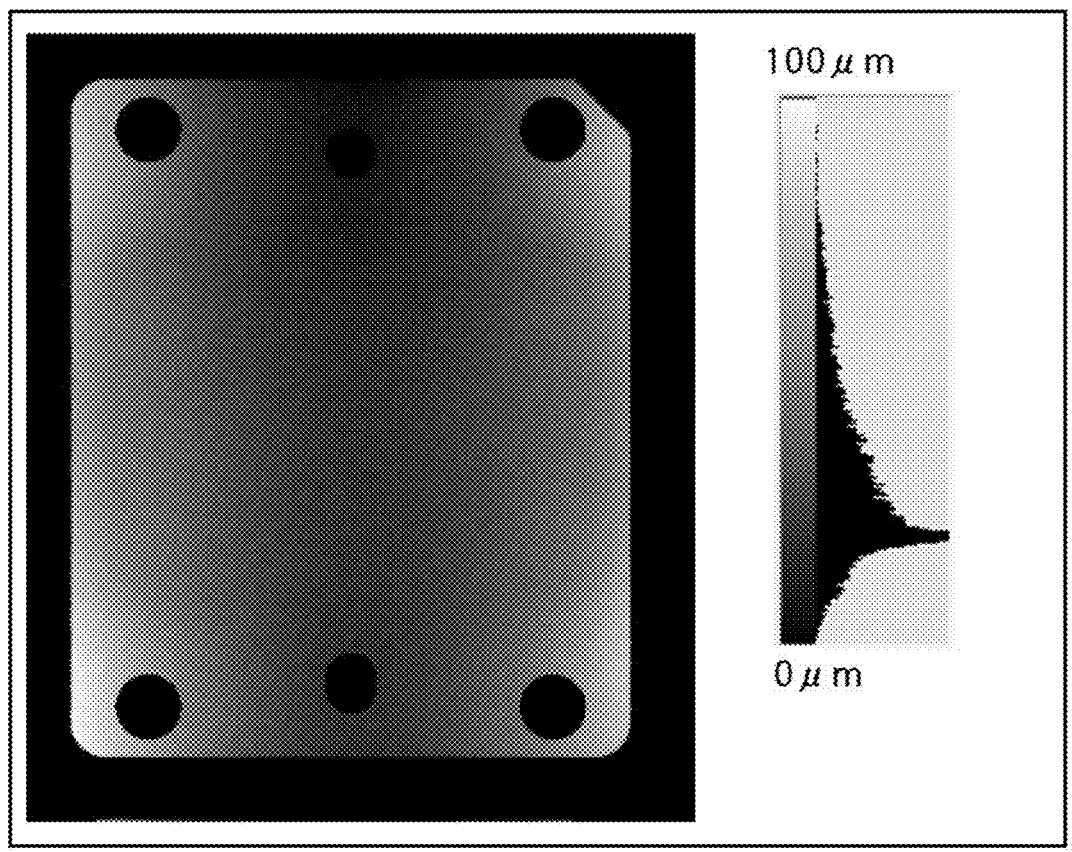
FIG. 13 is a diagram showing a protrusion amount distribution of a lower surface of a bottom plate after the frame member joining step in a comparative example.

FIGS. 12 and 13 show, in a structure in which the frame member described above is joined to the bottom plate, results of a measurement of a state of warpage of the lower surface of the bottom plate after joining. FIG. 12 is a diagram showing a protrusion amount distribution of the lower surface of the bottom plate after the frame member joining step in a sample A. FIG. 13 is a diagram showing a protrusion amount distribution of the lower surface of the bottom plate after the frame member joining step in a sample B. FIGS. 12 and 13 respectively show distributions of protrusion amounts relative to 0 μm representing a protrusion amount of a portion positioned uppermost (in other words, a most recessed portion) on the lower surface.

In the sample A, the bottom plate 10 with the shape shown in FIGS. 3A to 3E was used. In the bottom plate 10 of the sample A, a length of the first side 15a was approximately 30 mm, a length of the fourth side 15d was approximately 29 mm, and a maximum thickness D was approximately 3.5 mm. A height d3 of the inside part 12b was approximately 1.4 mm, and a planar shape thereof was a rectangular shape with a short side of approximately 13.7 mm and a long side of approximately 19.5 mm. The first parallel surface 13a was shaped as an approximately 4.6 mm square, and a depth d1 thereof was approximately 0.05 mm. The second parallel surface 13b was shaped as an isosceles right triangle with two sides forming the right angle being approximately 4.6 mm long, and a depth d2 thereof was approximately 0.04 mm. It should be noted that, in FIGS. 3A to 3E, level differences of the lower surface 11 are shown exaggerated relative to the actually used sample A. Cu was used as the bottom plate 10, steel plate cold (SPC) was used as the frame 21, SPC was used as the first plate 22A and the second plate 22B, and KOVAR® was used as the first lead terminal 23A and the second lead terminal 23B.

The sample B is the same as the sample A with the exception of the lower surface not being provided with a recess, external dimensions of the bottom plate in a plan view being approximately 35 mm×approximately 29 mm, and through-holes, cutout shapes, and the like being slightly different due to a difference in external dimensions.

As shown in FIG. 13, on the lower surface of the bottom plate of the sample B, as a result of the joining of the frame, a central portion had a value close to 0 μm and warpage occurred such that the first side, the second side, and vicinities thereof protruded. In particular, the four corners protruded significantly. The most protruded portion in the sample B was a bottom left corner in FIG. 13 that protruded more than the central part of the lower surface by approximately 0.08 mm. On the other hand, as shown in FIG. 12, on the lower surface 11 of the bottom plate 10 of the sample A, 0 μm and values close thereto were distributed in peripheral portions instead of in the reference part 11b. The most protruded portion in the sample A was near a boundary of the inclined surface 14 with the first parallel surface 13a that protruded more than the central part of the lower surface by approximately 0.02 mm. In addition, a comparison of protrusion amounts of a portion directly below the inside part 12b or, in other words, a portion directly below the portion where the semiconductor element 30 is disposed revealed that, while the sample B exhibited many protrusion amounts of 0 μm and values close thereto, most portions of the sample A had protrusion amounts of around several ten μm. In other words, while the portion directly below the semiconductor element 30 was recessed in the sample B, the portion directly below the semiconductor element 30 was protruded and outer peripheral portions were recessed in the sample A. By adopting such a structure of the sample A, because the portion directly below the semiconductor element 30 can be readily brought into contact with a heat sink or the like, heat generated by the semiconductor element 30 can conceivably be transferred to the heat sink or the like in an efficient manner.

As shown in FIG. 12, a level difference due to the first parallel surface 13a or the second parallel surface 13b may remain after joining the frame member. Alternatively, in consideration of a state of occurrence of such warpage, the recess 11a may be designed with a shape and a depth which prevent a level difference from being retained after the joining of the frame member. Because states of occurrence of warpage is likely to vary, it is conceivable that a design which causes the reference part 11b to protrude the most on the lower surface 11 after the joining of the frame member is more preferable than a design for making the entire lower surface 11 completely flat after the joining of the frame member. This is because causing the reference part 11b which is directly below the semiconductor element 30 to protrude enables heat generated by the semiconductor element 30 to be transferred to the heat sink or the like in an efficient manner.

As shown in FIG. 11D, the frame member can be joined to the bottom plate 10 so that the first wall 21a is positioned on the side of the first side 15a of the bottom plate 10 and the second wall 21b is positioned on the side of the second side 15b of the bottom plate 10.

In other words, the frame member can be joined so that the first plate 22A is positioned on the side of the first side 15a of the bottom plate 10 and the second plate 22B is positioned on the side of the second side 15b of the bottom plate 10. The first wall 21a and the second wall 21b on which the first plate 22A and the second plate 22B are provided are less likely to bend than the third wall 21c and the fourth wall 21d on which the plate bodies are not provided. As a result, with the disposition shown in FIGS. 11A to 11D, the bottom plate 10 is less likely to bend in a direction along the first side 15a (and the second side 15b) but is likely to bend in an intersecting direction thereof, or in other words, a direction along the third side 15c (and the fourth side 15d). Therefore, in this case, the reference part 11b of the bottom plate 10 is preferably provided in a shape that connects the third side 15c and the fourth side 15d as described earlier.

When the frame member has the frame 21 and the plate, only the frame 21 may be joined to the bottom plate 10 or both the frame 21 and the plate may be joined to the bottom plate 10. The frame member and the bottom plate 10 may be joined using a joining material such as silver solder. A comparison of linear expansion coefficients with the bottom plate 10 can be performed with a member directly joined to the bottom plate 10. In other words, when only the frame 21 is joined, the linear expansion coefficient of the frame 21 is set smaller than that of the bottom plate 10, and when both the frame 21 and the plate are joined, the linear expansion coefficients of both the frame 21 and the plate are set smaller than that of the bottom plate 10. The frame member may be joined to the bottom plate 10 so that the semiconductor element 30 and the like can be hermetically sealed by joining a lid 50 to be described later. A thickness of the frame 21 can preferably be set within a range of 0.1 to 1.0 mm and more preferably within a range of 0.2 to 0.8 mm. Examples of a material of the frame 21 include SPC. Compared to KOVAR®, SPC can be more readily processed into a shape of the frame member 20 and can be manufactured more inexpensively.

The first plate 22A and the second plate 22B can be respectively joined to an outside surface of the frame 21. Thicknesses of the first plate 22A and the second plate 22B are preferably respectively larger than the thickness of the frame 21. An example of a specific range of the thicknesses of the first plate 22A and the second plate 22B is around 1.0 to 3.0 mm. Examples of a material of the first plate 22A and the second plate 22B include metal materials such as KOVAR®. The first plate 22A and the second plate 22B respectively have, for example, an approximate rectangular parallelepiped shape. In other words, the shape of the first plate 22A and the second plate 22B may be a rectangular parallelepiped or a shape created by chamfering one or more corners of a rectangular parallelepiped. Each of the first plate 22A and the second plate 22B and the frame member 20 are joined using a joining material such as silver solder.

The first lead terminal 23A and the second lead terminal 23B are members for electrically connecting the semiconductor element 30 to an external power supply or the like. The first lead terminal 23A and the second lead terminal 23B can be respectively fixed to the first plate 22A and the second plate 22B via an insulating member such as borosilicate glass. Because the first lead terminal 23A and the second lead terminal 23B are not disposed on the lower surface 11 of the bottom plate 10, approximately an entire surface of the lower surface 11 of the bottom plate 10 can be used as a heat radiation surface. Examples of a material of the first lead terminal 23A and the second lead terminal 23B include KOVAR® and iron-nickel alloys.

The semiconductor device package obtained by the frame member joining step has the bottom plate 10 and the frame member. The bottom plate 10 has the lower surface 11 and the upper surface 12, the upper surface 12 has the outer peripheral part 12a and the inside part 12b, and a thickness of the bottom plate 10 in the inside part 12b is greater than a thickness of the bottom plate 10 in the outer peripheral part 12a. The frame member is joined to the outer peripheral part 12a of the bottom plate 10, and a linear expansion coefficient of the frame member is smaller than a linear expansion coefficient of the bottom plate 10. For example, as shown in FIG. 12, a most protruded portion of the lower surface 11 of the bottom plate 10 is preferably positioned directly below the inside part 12b. Accordingly, heat of the semiconductor element 30 that is fixed to the bottom plate 10 in a semiconductor element fixing step to be described later can be efficiently transferred to a heat sink or the like. In addition, a trace of the recess 11a may remain on the lower surface 11 of the bottom plate 10. For example, as shown in FIG. 12, a level difference having a shape like square or a level difference having a shape like triangular may be present in each of the four corners of the lower surface 11.

Semiconductor Element Fixing Step

Figure 2C:
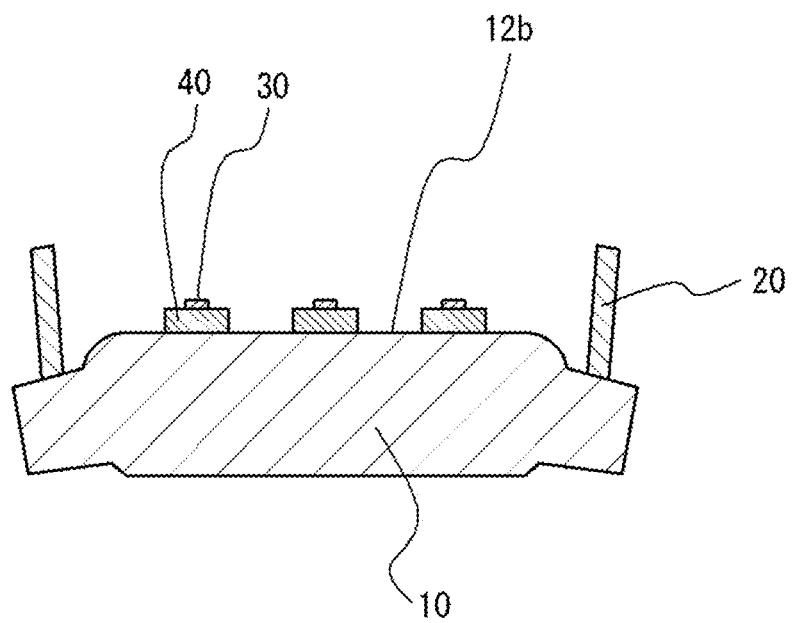
FIG. 2C is a schematic sectional view showing a semiconductor element fixing step.

As shown in FIG. 2C, the semiconductor element 30 is fixed to the inside part 12b of the bottom plate 10 of a semiconductor device package.

Fixing the semiconductor element 30 to the inside part 12b is not limited to directly fixing the semiconductor element 30 to the inside part 12b and also includes cases where the semiconductor element 30 is fixed to the inside part 12b via another member. In FIG. 2C, a submount 40 is fixed to the inside part 12b and the semiconductor element 30 is fixed to the submount 40. When disposing the semiconductor element 30 via the submount 40, a material having a linear expansion coefficient between those of the bottom plate 10 and the semiconductor element 30 may be used as a material of the submount 40.

The semiconductor element 30 is a light-emitting element such as a semiconductor laser element. Examples of a semiconductor laser element include those having an active layer made of a nitride semiconductor. When using such a semiconductor laser element, because dust accumulation is likely to occur due to an emitted laser beam, a hermetic seal is preferably provided. Examples of nitride semiconductors include group III-V semiconductors such as $Al_xIn_yGa_{1-x-y}N$ ($0 \leq x \leq 1$, $0 \leq y \leq 1$, $0 \leq x+y \leq 1$). For example, the semiconductor laser element includes a semiconductor stack in which an n-side semiconductor layer, an active layer, and a p-side semiconductor layer are stacked in this order, an n electrode electrically connected to the n-side semiconductor layer, and a p electrode electrically connected to the p-side semiconductor layer. For example, a semiconductor laser element with a high output of 1 W or higher can be used as the semiconductor element 30.

As shown in FIG. 2C, a plurality of the semiconductor elements 30 may be disposed. The larger the number of the disposed semiconductor elements 30, the greater the heat generation when driving the semiconductor device. A structure in which a portion directly below the semiconductor element 30 is less likely to be lifted upward by warpage is particularly suitable for such a semiconductor device with large heat generation. For example, the number of the semiconductor elements 30 is 2 or more and can range from 2 to 40. The plurality of semiconductor elements 30 can be electrically connected to each other by a wire or the like. As the wire, gold, copper, aluminum, or the like can be used.

Lid Joining Step

Figure 2D:
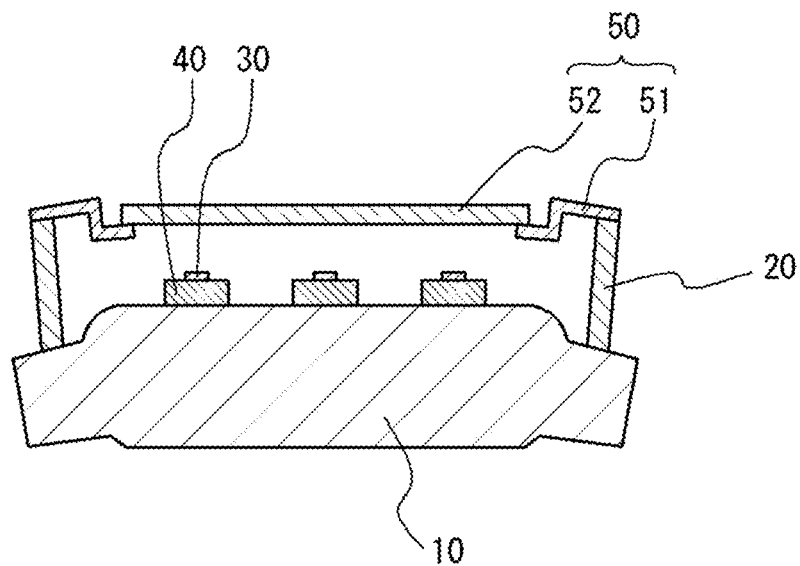
FIG. 2D is a schematic sectional view showing a lid joining step.
Figure 14:
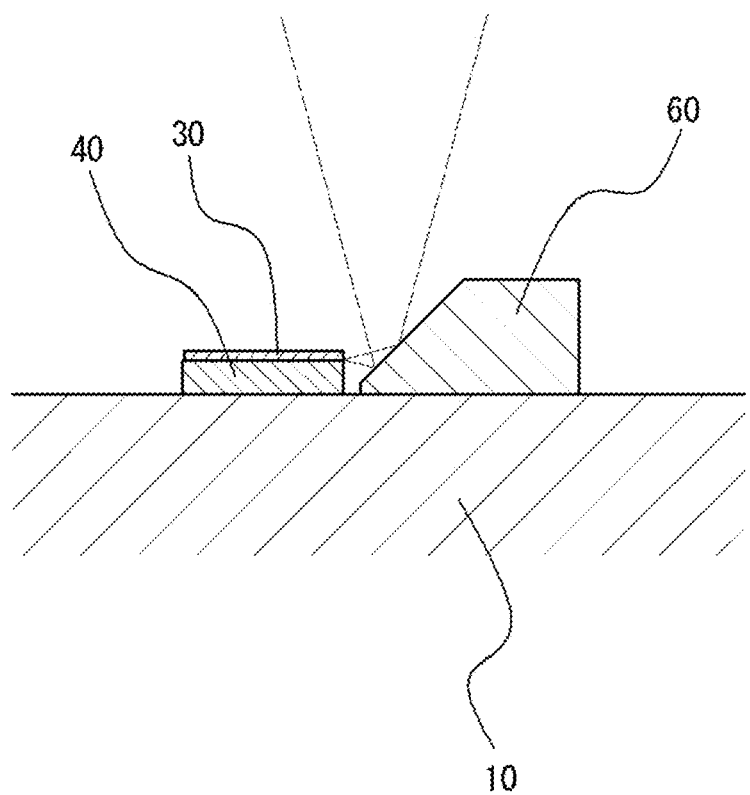
FIG. 14 is a partial enlarged view of a semiconductor element and a vicinity thereof.

As shown in FIG. 2D, the semiconductor element 30 can be sealed by joining the lid 50 to the frame member 20. For example, the lid 50 has a frame part 51 and a transmissive part 52. When the semiconductor element 30 is a light-emitting element, light from the semiconductor element 30 passes through the transmissive part 52 to be extracted to the outside. FIG. 14 shows a partial enlarged view of the semiconductor element 30 and a vicinity thereof. As shown in FIG. 14, the semiconductor device may have a light-reflecting member 60. The light-reflecting member 60 may be fixed to the bottom plate 10 after the frame member joining step and before the lid joining step. In FIG. 14, a path of light from the semiconductor element 30 is schematically indicated by dash lines. Light (for example, laser light) from the semiconductor element 30 reaches the transmissive part 52 either directly or via the light-reflecting member 60 or the like. A phosphor-containing member may be disposed on an optical path of light from the semiconductor element 30 to extract fluorescence excited by the light from the semiconductor element 30 to the outside.

As the frame part 51, glass, a metal, a ceramic, or a material combining these materials can be used. Because the use of a metal as the frame part 51 enables the frame member 20 and the lid 50 to be fixed to each other by welding or the like, the semiconductor element 30 can be more readily hermetically sealed. As the transmissive part 52, a member that transmits at least a part of light emitted inside a sealed space enclosed by the bottom plate 10, the frame member 20, and the lid 50 can be used. For example, a member that transmits light emitted by the semiconductor element 30 is used.

As shown in FIG. 2D, the obtained semiconductor device has the bottom plate 10, the frame member 20, and the semiconductor element 30. The bottom plate 10 has the lower surface 11 and the upper surface 12, the upper surface 12 has the outer peripheral part 12a and the inside part 12b, and a thickness of the bottom plate 10 in the inside part 12b is greater than a thickness of the bottom plate 10 in the outer peripheral part 12a. The frame member 20 is joined to the outer peripheral part 12a of the bottom plate 10, and a linear expansion coefficient of the frame member 20 is smaller than a linear expansion coefficient of the bottom plate 10. The semiconductor element 30 is fixed to the inside part 12b of the bottom plate 10. As described earlier, a most protruded portion of the lower surface 11 of the bottom plate 10 is preferably positioned directly below the inside part 12b. Accordingly, heat of the semiconductor element 30 can be released to the heat sink or the like in an efficient manner. In addition, a trace of the recess 11a may remain on the lower surface 11 of the bottom plate 10. For example, as shown in FIG. 12, a level difference having a shape like a square or a level difference having a shape like a triangle may be present in each of the four corners of the lower surface 11.

In addition, a step of screwing the obtained semiconductor device to a heat radiating member such as a heat sink may be further provided. Screwing can be performed by inserting screws into the cutout shapes 17 of the bottom plate 10. Through-holes may be used instead of the cutout shapes 17. Using the cutout shapes 17 instead of through-holes enables the bottom plate 10 to be downsized. Furthermore, a step of fixing an optical member such as a lens to the semiconductor device may be further provided before or after the screwing step.

What is claimed is:

1. A semiconductor device comprising:
    a bottom plate having an upper surface and a lower surface, wherein the upper surface comprises an outer peripheral part and an inside part that is enclosed by the outer peripheral part and that protrudes more upward than the outer peripheral part, wherein a thickness of the bottom plate at the inside part is greater than a thickness of the bottom plate at the outer peripheral part, and wherein the lower surface comprises a reference part and at least one recess positioned above the reference part;
    a frame joined to the upper surface of the bottom plate and comprising a first through-hole that penetrates the frame so as to connect an inside surface and an outside surface of the frame;
    a plate jointed to one of the outside surface of the frame or the inside surface of the frame, the plate comprising a second through-hole that penetrates the plate in a same direction as that of the first through-hole, a thickness of the plate being greater than a thickness of the frame;
    a lead terminal inserted into the first through-hole and the second through-hole;
    a fixing member provided in the second through-hole and fixing the lead terminal; and
    a semiconductor element fixed to the inside part.

2. The semiconductor device according to claim 1, wherein:
    the at least one recess comprises a plurality of recesses.

3. The semiconductor device according to claim 1, wherein:
    at least a portion of the reference part is disposed in a central part of the lower surface.

4. The semiconductor device according to claim 1, wherein:
    the lower surface of the bottom plate has a shape like a square that comprises a first side and a second side that oppose each other and a third side and a fourth side that oppose each other.

5. The semiconductor device according to claim 4, wherein:
    the at least one recess comprises a plurality of recesses that are disposed at four corners of the lower surface.

6. The semiconductor device according to claim 4, wherein:
    the reference part has a shape connecting the third side and the fourth side.

7. The semiconductor device according to claim 1, wherein:
    the frame has a shape like a square in a top view and that comprises a first wall and a second wall that oppose each other and a third wall and a fourth wall that oppose each other, and
    the first wall comprises the first through-hole.

8. The semiconductor device according to claim 7, wherein:
    the plate is joined to the first wall.

9. The semiconductor device according to claim 1, wherein:
    the semiconductor element is a semiconductor laser element.

10. A semiconductor device package comprising,
a bottom plate having an upper surface and a lower surface, wherein the upper surface comprises an outer peripheral part and an inside part that is enclosed by the outer peripheral part and that protrudes more upward than the outer peripheral part, wherein a thickness of the bottom plate at the inside part is greater than a thickness of the bottom plate in the outer peripheral part, and wherein the lower surface comprises a reference part and at least one recess positioned above the reference part;
a frame joined to the upper surface of the bottom plate and comprising a first through-hole that penetrates the frame so as to connect an inside surface and an outside surface of the frame;
a plate jointed to one of the outside surface of the frame or the inside surface of the frame, the plate comprising a second through-hole that penetrates the plate in a same direction as that of the first through-hole, a thickness of the plate being greater than a thickness of the frame;
a lead terminal inserted into the first through-hole and the second through-hole; and
a fixing member provided in the second through-hole and fixing the lead terminal.

11. The semiconductor device package according to claim 10, wherein:
the at least one recess comprises a plurality of recesses.

12. The semiconductor device package according to claim 10, wherein:
at least a portion of the reference part is disposed in a central part of the lower surface.

13. The semiconductor device package according to claim 10, wherein:
the lower surface of the bottom plate has a shape like a square that comprises a first side and a second side that oppose each other and a third side and a fourth side that oppose each other.

14. The semiconductor device package according to claim 13, wherein:
the at least one recess comprises a plurality of recesses that are disposed at four corners of the lower surface.

15. The semiconductor device package according to claim 13, wherein:
the reference part has a shape connecting the third side and the fourth side.

16. The semiconductor device package according to claim 10, wherein:
the frame has a shape like a square in a top view and that comprises a first wall and a second wall that oppose each other and a third wall and a fourth wall that oppose each other, and
the first wall comprises the first through-hole.

17. The semiconductor device according to claim 16, wherein:
the plate is joined to the first wall.

* * * * *